(12) United States Patent
Cheng et al.

(10) Patent No.: US 10,790,422 B2
(45) Date of Patent: Sep. 29, 2020

(54) LED DISPLAY DEVICE AND METHOD FOR MANUFACTURING THE SAME

(71) Applicant: SHENZHEN CREATELED ELECTRONICS CO., LTD., Shenzhen, Guangdong (CN)

(72) Inventors: Zhuo Cheng, Guangdong (CN); Xingzhong Zhu, Guangdong (CN); Lijian Luo, Guangdong (CN); Yanlin Bai, Guangdong (CN); Cailei Zhang, Guangdong (CN)

(73) Assignee: SHENZHEN CREATELED ELECTRONICS CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/470,805

(22) PCT Filed: Jan. 29, 2018

(86) PCT No.: PCT/CN2018/074482
§ 371 (c)(1),
(2) Date: Jun. 18, 2019

(87) PCT Pub. No.: WO2019/071879
PCT Pub. Date: Apr. 18, 2019

(65) Prior Publication Data
US 2019/0385988 A1    Dec. 19, 2019

(30) Foreign Application Priority Data
Oct. 12, 2017    (CN) .......................... 2017 1 0946272

(51) Int. Cl.
*H01L 33/56*    (2010.01)
*H01L 25/075*    (2006.01)
(Continued)

(52) U.S. Cl.
CPC .......... *H01L 33/56* (2013.01); *H01L 25/0753* (2013.01); *H01L 33/48* (2013.01);
(Continued)

(58) Field of Classification Search
CPC .. G06F 1/1633; G06F 1/1637; H04M 1/0266; H04M 1/026; H04M 1/0295;
(Continued)

(56) References Cited

U.S. PATENT DOCUMENTS 8,791,474 B1 *   7/2014  Bibl ..................... G09G 3/2003
                                                              257/100
9,547,338 B2 *   1/2017  Berg ...................... B29C 45/14
(Continued)

FOREIGN PATENT DOCUMENTS

CN    103208239 A    7/2013
CN    203966485 U    11/2014
(Continued)

*Primary Examiner* — Eduardo A Rodela
(74) *Attorney, Agent, or Firm* — Cantor Colburn LLP

(57) ABSTRACT

An LED display device including: a bottom case, electronic components, a circuit board, and an LED lamp group, with no mask covering above the LED lamp group. A cured resin layer is potted over the LED lamp group fixed on the circuit board, and the cured resin layer is adhered with a light-transmitting film, and the cured resin layer and the light-transmitting film together serves as a protective layer. The LED display device has advantages in adjusting and controlling the contrast, viewing angle, and color uniformity of the display device; the performance in moisture proof, windproof, rainproof, anti-corrosion, heat dissipation, and ultraviolet resistance is obviously improved, which can significantly reduce the lamp dysfunction rate and lamp collision rate of the display device, prevent the lamp bead from falling off and avoid other damage to the lamp bead, thereby making the maintenance procedure simpler.

15 Claims, 2 Drawing Sheets

(51) Int. Cl.
  *H05K 1/18* (2006.01)
  *H05K 3/28* (2006.01)
  *H01L 33/62* (2010.01)
  *H01L 33/48* (2010.01)
  *H01L 33/52* (2010.01)
  *H01L 33/50* (2010.01)

(52) U.S. Cl.
  CPC .......... *H01L 33/483* (2013.01); *H01L 33/486* (2013.01); *H01L 33/50* (2013.01); *H01L 33/52* (2013.01); *H01L 33/62* (2013.01); *H05K 1/181* (2013.01); *H05K 3/284* (2013.01); *H05K 2201/10106* (2013.01); *H05K 2203/1311* (2013.01)

(58) Field of Classification Search
  CPC .... H05K 3/363; H05K 5/0017; H05K 7/1461; H05K 7/1481; H01L 25/075; H01L 25/0753; H01L 25/13; H01L 33/48; H01L 33/483; H01L 33/486; H01L 33/50; H01L 33/62; H01L 33/52; H01L 33/56; H01L 33/06; G02F 1/13338
  See application file for complete search history.

(56) References Cited

U.S. PATENT DOCUMENTS

| | | | |
|---|---|---|---|
| 10,269,779 B2 * | 4/2019 | Lu | H01L 33/62 |
| 2003/0189829 A1 * | 10/2003 | Shimizu | F21L 4/00 362/240 |
| 2014/0111953 A1 * | 4/2014 | McClure | G06F 3/044 361/749 |
| 2014/0159043 A1 * | 6/2014 | Sakariya | H01L 27/124 257/59 |
| 2014/0159064 A1 * | 6/2014 | Sakariya | H01L 25/0753 257/88 |
| 2015/0187740 A1 * | 7/2015 | McGroddy | H01L 25/0753 345/82 |
| 2016/0070414 A1 * | 3/2016 | Shukla | G02F 1/1309 345/178 |
| 2016/0282652 A1 * | 9/2016 | Kuk | G02F 1/13452 |
| 2016/0360712 A1 * | 12/2016 | Yorio | A01G 7/045 |
| 2016/0372630 A1 * | 12/2016 | Jang | H01L 33/025 |
| 2017/0012095 A1 * | 1/2017 | Zhong | G02F 1/13306 |
| 2017/0068362 A1 * | 3/2017 | Den Boer | H01L 33/60 |
| 2017/0148771 A1 * | 5/2017 | Cha | H01L 25/0753 |
| 2018/0077813 A1 * | 3/2018 | Lancaster-Larocque | G06F 1/163 |
| 2019/0274222 A1 * | 9/2019 | Kim | H04M 1/0277 |

FOREIGN PATENT DOCUMENTS

| | | |
|---|---|---|
| CN | 205943369 U | 2/2017 |
| CN | 106683578 A | 5/2017 |
| CN | 107633777 A | 1/2018 |
| CN | 207282092 U | 4/2018 |

* cited by examiner

LED DISPLAY DEVICE AND METHOD FOR MANUFACTURING THE SAME

CROSS REFERENCE TO RELATED APPLICATIONS

This application is a U.S. National Stage of International Patent Application No. PCT/CN2018/074482 filed on Jan. 29, 2018, which claims priority to Chinese Patent Application No. 201710946272.4 filed on Oct. 12, 2017. The aforementioned applications are hereby incorporated by reference in their entireties.

TECHNICAL FIELD

The present application relates to the technical field of LED display devices, and particularly to the technical field of small-pitch LED display devices, and more particularly to an LED display device and a method of manufacturing the same.

BACKGROUND

In recent years, the demand for small-pitch LED display devices has exploded, and higher requirements have been placed on important optical properties such as resolution, contrast, viewing angle, and color uniformity of LED display devices. The smaller the pitch, the larger the resolution per unit area, and the clearer the display image, thus the smaller the LED lamp bead is needed. The smaller the LED lamp bead, the worse the stability of the single lamp bead, and it is very susceptible to the external environment. It is more and more difficult to meet the requirements of normal use in terms of moisture proof, windproof, rainproof, anti-corrosion, heat dissipation, and ultraviolet resistance, and the failure rate of the lamp bead also increases during transportation, installation, and use.

At present, the LED display industry generally adopts the method of covering a mask above the lamp group to protect the lamp bead. The mask has a series of lamp holes matching the size of the lamp bead and of the same amount, by snapping each lamp bead into individual lamp holes of the mask, the mask is covered to and fixed on the surface of the lamp group. However, since the mask is covered to the lamp group through snapping the lamp bead into the lamp hole, the LED display device often has phenomena of lamp collision and lamp dysfunction, that phenomena are particularly prominent in the field of small-pitch LED display devices. During the maintenance, removing the mask onto which the lamp group is snapped is needed, it is easy to bring the problems of dead lamp and lamp bead falling off, causing secondary damage to the lamp bead, and even a larger area of lamp dysfunction, thus maintenance is quite troublesome. This has become a major problem in the use and maintenance of small-pitch LED display devices.

Technical Problems

The technical problem to be solved by the present application is to provide an LED display device, particularly to provide a small-pitch LED display device, the LED display device can be an LED display module, an LED display cabinet, or an LED display screen. The display device has obvious performance improvement in moisture proof, windproof, rainproof, anti-corrosion, heat dissipation, and ultraviolet resistance, can significantly reduce the lamp dysfunction rate and lamp collision rate of the display device, and can effectively prevent the lamp bead from falling off and avoid other damages to the lamp bead during the later maintenance, and the maintenance procedure is simpler; at the same time, it can better control and adjust the contrast, viewing angle, and color uniformity of the LED display device.

Technical Solutions

In order to solve the above technical problem, the technical solutions adopted by the present application are as follows: an LED display device of the present application includes a bottom case, an electronic component, a circuit board, and an LED lamp group, with no mask covered to the LED lamp group, the cured resin layer is potted over the LED lamp group fixed on the circuit board, the cured resin layer is covered with a light-transmitting film, and the cured resin layer and the light-transmitting film together form a protective layer.

Further, the bottom case defines therein a cavity for accommodating and fixing electronic components, and the bottom case further includes a fixing and supporting structure configured for fixing and supporting the circuit board.

Further, the circuit board is a printed circuit board or a glass fiber epoxy resin copper clad laminate.

Further, the LED lamp group is fixed on a front side of the printed circuit board by means of surface mount technology (SMT) packaging, or is fixed on a front face of the glass fiber epoxy resin copper clad laminate by means of chips on board (COB) packaging.

Further, the cured resin layer is obtained by heating and melting a sealing transparent material and a propylene polymer, has a thickness of 0.5 mm to 1 mm, a transmittance of 50% to 90%, and a hardness of 65 Shore A to 75 Shore A, and is adhered to the front face of the LED lamp group.

Further, the light-transmitting film has a thickness of 0.05 mm to 0.1 mm and a transmittance of 50% to 55%, and is adhered to the cured resin layer.

The present application further provides a method for manufacturing a display device, including the following steps:

S1: fixing an LED lamp group to a front side of a printed circuit board by means of SMT packaging to form a circuit board, or fixing the LED lamp group to the front side of a glass fiber epoxy resin copper clad laminate by means of COB packaging to form the circuit board;

S2: heating and melting a sealing transparent material and a propylene polymer to a liquid state, and then stirring and mixing to form a liquid resin mixture;

S3: placing the circuit board in a mold, and then injecting the liquid resin mixture into the circuit board in the mold;

S4: baking and curing the circuit board in which the liquid resin mixture is injected to form a cured resin layer;

S5: taking out the LED lamp group circuit board and attaching a light-transmitting film; and S6: splicing and assembling the circuit board in step S5, a bottom case, and electronic components to form an LED display module, an LED display cabinet or an LED display screen.

Beneficial Effects

The LED display device provided by the present application has a cured resin layer on the surface of the lamp group, and the use of the cured resin layer has advantages over mask in adjusting and controlling the contrast, viewing angle, and color uniformity of the display device. The performance in moisture proof, windproof, rainproof, anticorrosion, heat dissipation, and ultraviolet resistance is obviously improved, which can significantly reduce the lamp dysfunction rate and lamp collision rate of the display device. Based on that the display device is formed by splicing a plurality of single display units, repairs can be made during the later maintenance by replacing display units of the same size. Compared with the LED display device having a mask, the LED display device provided by present application can more effectively prevent the lamp bead from falling off and avoid other damages to the lamp bead, and the maintenance procedure is simpler.

DESCRIPTION OF THE DRAWINGS

In order to more clearly illustrate the technical solution in embodiments of the present application, the drawings, which are to be used in the description of the embodiments or the prior art, will be briefly described hereinafter. It will be apparent that the drawings described in the following description are merely embodiments of the present application. According to these drawings, other drawings may be obtained by those skilled in the art without paying creative labor.

Figure 1:
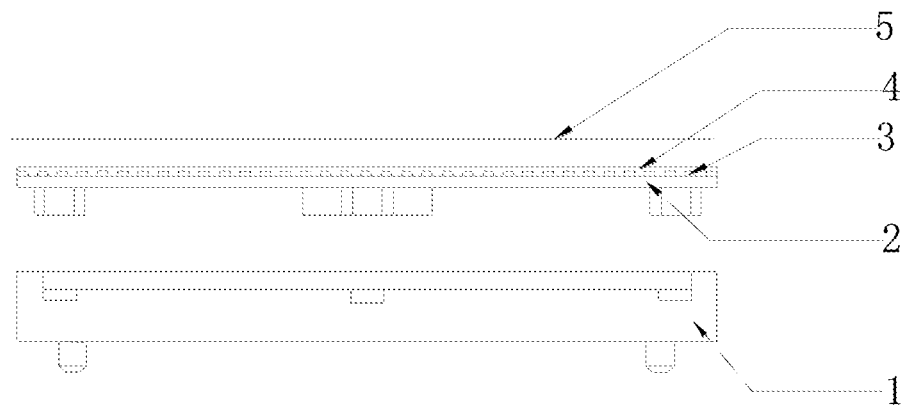
FIG. 1 is an exploded view of an LED display device of the present application.

Among them, reference numerals in the figures are:
1—Bottom case; 2—Circuit board; 3—LED light group; 4—Cured resin layer; 5—Light-transmitting film.

EMBODIMENTS OF THE INVENTION

Figure 2:
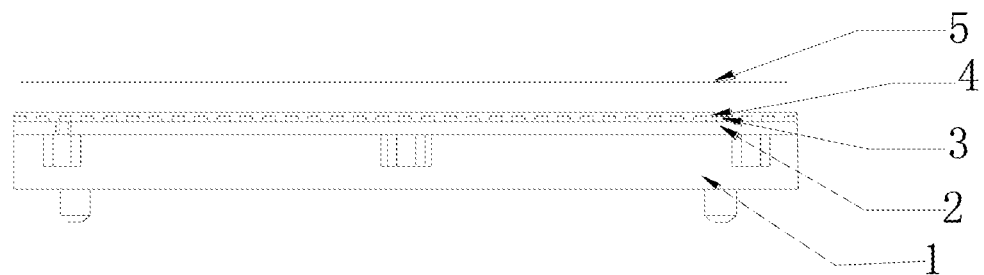
FIG. 2 is a front view of an LED display device of the present application.
Figure 3:
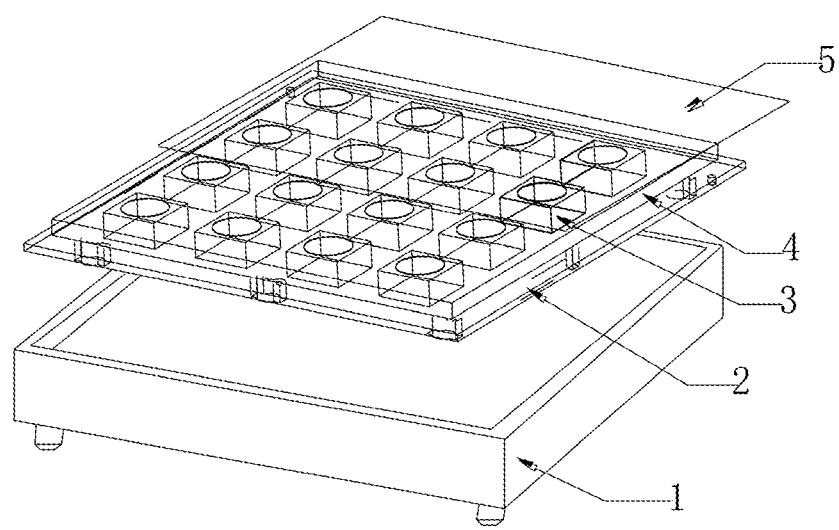
FIG. 3 is a perspective view of an LED display device of the present application.

The embodiments of the present application are described in detail below, and the examples of the embodiments are illustrated in the drawings, where, the same or similar reference numerals are used to refer to the same or similar elements or elements having the same or similar functions. The embodiments described below with reference to FIGS. 1-3 are exemplary, these embodiments are intended to explain the present application and are not to be construed as limiting the present application.

When describing the present application, it should be understood that the orientation or positional relationship indicated by terms "length", "width". "upper". "lower", "front", "rear", "left", "right", "vertical", "horizontal", "top", bottom", "inside", "outside", or the like is based on the orientation or positional relationship shown in the drawings, and is merely for facilitating and simplifying the description of the present application, and it does not indicate or imply that the device or component referred to must have a particular orientation or be constructed and operated in a particular orientation, thus it is not to be construed as defining the present application.

Moreover, the terms "first" and "second" are used for descriptive purposes only and are not to be construed as indicating or implying a relative importance or implicitly indicating the number of technical features indicated. Thus, features defining "first" and "second" may include one or more of the features either explicitly or implicitly. When describing the present application, the meaning of "a plurality of" or "multiple" is two or more unless otherwise particularly defined.

In the present application, the terms "installation", "connected", "adhered", "fixed" and the like shall be understood broadly, unless otherwise explicitly stated and defined. For example, it can be a fixed connection, a detachable connection or integrated; it can be a mechanical connection or an electrical connection; it can be directly connected, indirectly connected through an intermediate medium, or an internal communication of two elements or the interaction of two elements. For those skilled in the art, the specific meanings of the above terms in the present application can be understood on a case-by-case basis.

As shown in FIGS. 1-3, the LED display device of the present application includes: a bottom case 1, electronic components, a circuit board 2, an LED lamp group 3, and a cured resin layer 4. The conventional LED display device is covered by a mask above the LED lamp group 3, so as to have a certain protective effect on the surface of the LED lamp group 3, while the LED display device of the present application breaks through the conventional thinking, with no mask covered on the surface of the LED lamp group 3. The LED lamp group 3 is fixed above the circuit board 2, the cured resin layer 4 is potted over the LED lamp group 3, and a light-transmitting film 5 is adhered over the cured resin layer 4.

As shown in FIG. 3, the LED display device includes: the bottom case 1, electronic components, the circuit board 2, the LED lamp group 3, the cured resin layers 4, and a light-transmitting film 5. The electronic components are fixed inside a cavity of the bottom case 1. The circuit board 2 adopts a printed circuit board or a glass fiber epoxy resin copper clad laminate, the LED lamp group 3 is fixed on the front side of the printed circuit board by means of SMT packaging, the circuit board 2 in which the LED lamp group 3 is packaged is horizontally placed in a mold corresponding to the size of the circuit board 2, a sealing transparent material and a propylene polymer are heated to a high temperature and melted into a liquid state, after being uniformly stirred and mixed, a liquid resin mixture is formed. The liquid resin mixture is injected into the mold to yield a resin layer with a thickness of 1 mm, then drying and baking are performed to obtain the circuit board 2 to which the cured resin layer 4 is adhered and the LED lamp group 3 is fixed. The transmittance of the cured resin layer 4 is 70%, and the hardness value is 70 Shore A. The light-transmitting film 5 is adhered to the cured resin layer 4, and the light-transmitting film 5 has a thickness of 0.1 mm and a transmittance of 50%. Four pieces of said circuit boards 2 with lamp group packaged, cured resin layer 4 and light-transmitting film 5 adhered are spliced into a main body of the LED display module, and then they are fixed and supported by the bottom case 1 to form an LED display module. Four pieces of said display module and the bottom case 1 are integrally assembled to form an LED display cabinet, and an integrated LED display screen can be obtained by splicing according to the required size.

A method for manufacturing the above display device, including the following steps:

S1: Fixing an LED lamp group 3 to a front side of a printed circuit board by means of SMT packaging, or fixing the LED lamp group 3 to a front side of a glass fiber epoxy resin copper clad laminate by means of COB packaging.

S2: Heating and melting a sealing transparent material and a propylene polymer to a liquid state, after stirring and mixing, performing vacuuming and degassing treatment to form a liquid resin mixture.

S3: Placing the circuit board 2 horizontally in a mold matching the size of the circuit board 2, and then injecting the liquid resin mixture into the circuit board 2 in the mold, and adjusting the thickness of the resin layer through the mold.

S4: Moving the mold containing the circuit board 2 injected with the liquid resin mixture to a drying rack for a certain time, and then baking and curing the liquid resin mixture to form a cured resin layer 4.

S5: Taking out the LED lamp group circuit board 2 adhered with cured resin layer 4 and attaching a light-transmitting film 5.

S6: Splicing four identical circuit boards 2, a bottom case 1, and electronic components into a whole body so as to form an LED display module.

S7: Performing module test, assembling four identical LED display modules into an LED display cabinet when lamp dysfunction rate, lamp collision rate, the performance of moisture proof, windproof, rainproof, anti-corrosion, ultraviolet resistance, and contrast, brightness, color uniformity and the like meet the production requirements.

S8: obtaining an integrated LED display screen by assembling and splicing according to the required size.

The LED display device obtained by the LED display device manufacturing method of the present application is provided with a cured resin layer 4 and a light-transmitting film 5 on the surface of the lamp group, the cured resin layer 4 has a certain hardness and forms a protective layer together with the light-transmitting film 5, the protective layer can obviously improve the performance of the LED display device in moisture proof, windproof, rainproof, anti-corrosion, ultraviolet resistance, and the like, effectively reduce the lamp dysfunction rate and the lamp collision rate. Meanwhile, the LED display device can be changed from point emitting to surface emitting through the cured resin layer 4, and contrast, viewing angle, and color uniformity can be improved, heat dissipation capacity can also be improved from point dissipation of single LED lamp bead to surface dissipation of LED lamp group 3, thereby extending the service life of the lamp bead.

The above is only the preferred embodiment of the present application, and is not intended to limit the present application. Any modifications, equivalent substitutions, and improvements made within the spirit and principles of the present application are included in the protection scope of the present application.

What is claimed is:

1. An LED display device, comprising: a bottom case, electronic components, a circuit board, and an LED lamp group, wherein
   the lamp group is fixed above the circuit board, a cured resin layer is potted over the lamp group, the bottom case defines therein a cavity configured for accommodating and fixing the electronic components, and the bottom case further comprises a fixing and supporting structure configured for fixing and supporting the circuit board;
   the material of the cured resin layer is a resin mixture obtained by heating and melting a sealing material and a propylene polymer.

2. The LED display device according to claim 1, wherein the circuit board is a printed circuit board or a glass fiber epoxy resin copper clad laminate.

3. The LED display device according to claim 1, wherein the cured resin layer has a thickness of 0.5 mm to 1 mm, a transmittance of 50% to 90%, and a hardness of 65 Shore A to 75 Shore A.

4. The LED display device according to claim 3, wherein the cured resin layer is adhered with a light-transmitting film.

5. The LED display device according to claim 4, wherein the light-transmitting film has a thickness of 0.05 mm to 0.1 mm.

6. A method for manufacturing the LED display device according to claim 1, comprising the following steps:
   S1: fixing the LED lamp group to the front side of the printed circuit board by means of surface mount technology packaging to form the circuit board, or fixing the LED lamp group to the front side of a glass fiber epoxy resin copper clad laminate by means of chips on board packaging to form the circuit board;
   S2: heating a sealing transparent material and a propylene polymer to a molten state, and stirring and mixing to form a liquid resin mixture;
   S3: placing the circuit board horizontally in a mold, and then injecting the liquid resin mixture into the mold so as to form a prefabricated resin layer;
   S4: baking and curing the prefabricated resin layer so as to form a cured resin layer;
   S5: taking out the circuit board adhered with the cured resin layer and the LED lamp group, and attaching a light-transmitting film thereto; and
   S6: splicing and assembling the circuit board adhered with the cured resin layer and the LED lamp group in step S5, the bottom case, and electronic components to form an LED display module, an LED display cabinet, or an LED display screen.

7. The method of claim 6, wherein the circuit board is a printed circuit board or a glass fiber epoxy resin copper clad laminate.

8. The method of claim 7, wherein the LED lamp group is fixed on a front side of the printed circuit board by means of surface mount technology packaging, or is fixed on a front face of the glass fiber epoxy resin copper clad laminate by means of chips on board packaging.

9. The method of claim 8, wherein the cured resin layer has a thickness of 0.5 mm to 1 mm, a transmittance of 50% to 90%, and a hardness of 65 Shore A to 75 Shore A.

10. The method of claim 9, wherein the cured resin layer is adhered with a light-transmitting film.

11. The method of claim 10, wherein the light-transmitting film has a thickness of 0.05 mm to 0.1 mm.

12. An LED display device, comprising: a bottom case, electronic components, a circuit board, and an LED lamp group, wherein
   the lamp group is fixed above the circuit board, a cured resin layer is potted over the lamp group, the bottom case defines therein a cavity configured for accommodating and fixing the electronic components, and the bottom case further comprises a fixing and supporting structure configured for fixing and supporting the circuit board;
   the circuit board is a printed circuit board or a glass fiber epoxy resin copper clad laminate;
   the LED lamp group is fixed on a front side of the printed circuit board by means of surface mount technology packaging, or is fixed on a front face of the glass fiber epoxy resin copper clad laminate by means of chips on board packaging; and
   the material of the cured resin layer is a resin mixture obtained by heating and melting a sealing material and a propylene polymer.

13. The LED display device according to claim 12, wherein the cured resin layer has a thickness of 0.5 mm to 1 mm, a transmittance of 50% to 90%, and a hardness of 65 Shore A to 75 Shore A.

14. The LED display device according to claim 13, wherein the cured resin layer is adhered with a light-transmitting film.

15. The LED display device according to claim 14, wherein the light-transmitting film has a thickness of 0.05 mm to 0.1 mm.

\* \* \* \* \*